United States Patent [19]
Boesch et al.

[11] Patent Number: 6,100,827
[45] Date of Patent: Aug. 8, 2000

[54] MODULATION SYSTEMS AND METHODS THAT COMPENSATE FOR DC OFFSET INTRODUCED BY THE DIGITAL-TO-ANALOG CONVERTER AND/OR THE LOW PASS FILTER THEREOF

[75] Inventors: Ronald D. Boesch, Morrisville; Domenico Arpaia, Cary, both of N.C.

[73] Assignee: Ericsson Inc., Research Triangle Park, N.C.

[21] Appl. No.: 09/151,622

[22] Filed: Sep. 11, 1998

[51] Int. Cl.[7] ..................................................... H03M 1/06
[52] U.S. Cl. ............................................................. 341/118
[58] Field of Search ........................... 455/110; 322/103; 375/222, 223, 279, 280; 341/118

[56]           References Cited
         U.S. PATENT DOCUMENTS

| 4,229,821 | 10/1980 | Jager et al. | 375/280 |
| 4,812,786 | 3/1989 | Davarian et al. | 332/103 |
| 5,248,970 | 9/1993 | Sooch et al. | 341/120 |
| 5,521,559 | 5/1996 | Ichihara | 332/117 |
| 5,530,722 | 6/1996 | Dent | 375/298 |
| 5,623,485 | 4/1997 | Bi | 370/209 |
| 5,701,106 | 12/1997 | Pikkarainen et al. | 332/100 |
| 5,764,692 | 6/1998 | Mucke | 375/216 |
| 5,787,362 | 7/1998 | Matero | 455/553 |
| 5,825,829 | 10/1998 | Borazjani et al. | 375/308 |
| 5,867,537 | 2/1999 | Dent | 375/298 |
| 5,872,810 | 2/1999 | Philips et al. | 375/222 |
| 6,014,407 | 1/2000 | Hunsinger et al. | 375/206 |
| 6,032,028 | 2/2000 | Dickey et al. | 455/110 |

FOREIGN PATENT DOCUMENTS

| 0 359 609 A1 | 3/1990 | European Pat. Off. . |
| 0 655 841 A1 | 5/1995 | European Pat. Off. . |
| WO 96/20540 | 7/1996 | WIPO . |

OTHER PUBLICATIONS

International Search Report, PCT/US98/23566, Mar. 31, 1999.

Candy and Temes, *"Oversampling Methods for A/D and D/A Conversion"*, Oversampling Delta–Sigma Data Converters, IEEE Press, 1992, pp. 1–25.

*Primary Examiner*—Trong Phan
*Attorney, Agent, or Firm*—Myers Bigel Sibley & Sajovec

[57]                ABSTRACT

Modulation systems and methods compensate for the DC offset that is introduced by the digital-to-analog converter and/or the low pass filter thereof. Compensation is preferably provided in the digital domain, to thereby reduce DC offset within acceptable limits for the modulation that is being used. More preferably, compensation is provided by subtracting from the digital input signal, a digital value representing the DC offset in the filtered analog signal that is introduced by the digital-to-analog converter and/or the low pass filter. A sensor senses the DC offset in the filtered analog signal. An analog-to-digital converter is responsive to the sensor to convert the sensed DC offset into a digital offset signal. A subtractor is responsive to the analog-to-digital converter to subtract the digital DC offset signal from the digital input signal and to apply the digital input signal minus the DC offset signal, to the digital-to-analog converter.

39 Claims, 7 Drawing Sheets

MODULATION SYSTEMS AND METHODS THAT COMPENSATE FOR DC OFFSET INTRODUCED BY THE DIGITAL-TO-ANALOG CONVERTER AND/OR THE LOW PASS FILTER THEREOF

FIELD OF THE INVENTION

This invention relates to modulation systems and methods, and more particularly to systems and methods that modulate digital input signals.

BACKGROUND OF THE INVENTION

Modulation systems and methods are widely used in transmitters to modulate an information input including voice and/or data onto a carrier. The carrier may be a final carrier or an intermediate carrier. The carrier frequency can be in UHF, VHF, RF, microwave or any other frequency band. Modulators are also referred to as "mixers" or "multipliers". For example, in a mobile radiotelephone, a modulator is used for the radiotelephone transmitter.

As is well known to those having skill in the art, modulation systems and methods for digital input signals generally include a Digital-to-Analog Converter (DAC) that converts the digital input signal into an analog signal. A low pass filter, also referred to as an "anti-aliasing filter", filters the analog signal to produce a filtered analog signal. A modulator modulates the filtered analog signal onto a carrier. The modulator includes a multiplier that is coupled to a local oscillator, such as a Voltage Controlled Oscillator (VCO), and to the filtered analog signal. The carrier including the filtered analog signal may then be transmitted by an antenna.

In modern communications systems, it is often desired to provide dual-mode modulation systems and methods that can modulate two types of communications signals. For example, in mobile radiotelephones, it is often important to provide a modulator that operates both in narrowband FM mode and in wideband Code Division Multiple Access (CDMA) mode. More particularly, in order to provide a mobile radiotelephone that can be used with both an IS-19 AMPS analog system and an IS-95 Direct Sequence Spread Spectrum (DSSS) wideband CDMA system, it is desirable to provide dual-mode modulation systems and methods.

In high performance communications systems, it also may be desirable to provide high carrier suppression. In order to provide high carrier suppression a low DC offset should be produced in the modulation system. For example, the required carrier suppression for FM modulation in an IS-19 AMPS analog system may be approximately −35 dBc. In order to provide an acceptable design margin, it may be preferred for the nominal carrier suppression to be -40 dBc, which can translate into a 14 mV differential DC offset signal when a 2V peak-to-peak differential information signal is generated in a balanced system.

Low DC offset in the digital input signal may be provided using conventional techniques. Unfortunately, however, the modulation system may generate its own DC offset. More specifically, the digital-to-analog converter and/or the low pass filter may generate DC offsets.

The DC offset that is generated in the digital-to-analog converter can be reduced using high performance digital-to-analog converters. Unfortunately, these digital-to-analog converters may be costly and complex. DC offset can be reduced in the low pass filter by providing a passive, off-chip filter with tight tolerance components. Unfortunately, such a passive off-chip filter may be costly and complex, and may consume excessive space in a portable radiotelephone.

SUMMARY OF THE INVENTION

It is therefore an object of the present invention to provide improved modulation systems and methods.

It is another object of the present invention to provide modulation systems and methods that can generate low DC offset.

These and other objects are provided, according to the present invention, by modulation systems and methods that compensate for the DC offset that is introduced by the digital-to-analog converter and/or the low pass filter thereof. Compensation is preferably provided in the digital domain, to thereby reduce DC offset to within acceptable limits for the modulation that is being used. More preferably, compensation is provided by subtracting from the digital input signal, a digital value representing the DC offset in the filtered analog signal that is introduced by the digital-to-analog converter and/or the low pass filter.

Modulation systems for digital input signals according to the invention include a digital-to-analog converter that converts the digital input signal into an analog signal. The analog signal is filtered by a low pass filter to produce a filtered analog signal. The digital-to-analog converter and/or the low pass filter introduce DC offset into the filtered analog signal. A modulator modulates the filtered analog signal onto a carrier. A DC offset compensator compensates for the DC offset in the filtered analog signal that is introduced by the digital-to-analog converter and/or the low pass filter.

DC offset compensators according to the invention preferably include a sensor that senses the DC offset in the filtered analog signal. An analog-to-digital converter is responsive to the sensor, to convert the sensed DC offset into a digital offset signal. A subtractor is responsive to the analog-to-digital converter, to subtract the digital DC offset signal from the digital input signal, and to apply the digital input signal less (minus) the digital DC offset signal, to the digital-to-analog converter. Accordingly, the sensed offset is subtracted in the digital domain. A scaler may also be included that is responsive to the analog-to-digital converter, to scale the digital DC offset signal into a scaled digital DC offset signal. The subtractor is then responsive to the scaler, to subtract the scaled digital DC offset signal from the digital input signal.

The subtractor need not continuously sense the DC offset in the filtered analog signal, but rather may do so on an intermittent and preferably periodic basis. For example, the DC offset compensator may include a latch that is responsive to the analog-to-digital converter to intermittently latch the digital DC offset signal and to apply the latched digital DC offset signal to the subtractor, such that the latched digital DC offset signal is subtracted from the digital input signal. When the analog-to-digital converter is clocked at a first clock rate, the latch can be clocked at a second clock rate that is lower than the first clock rate.

The sensor may comprise a low pass filter that senses the DC offset in the filtered analog signal. In one embodiment, the analog-to-digital converter is a one bit delta-sigma analog-to-digital converter. In another embodiment, a polarity inverter is responsive to the sensor, to periodically invert the polarity of the sensed DC offset signal. The analog-to-digital converter converts the periodically polarity inverted sensed DC offset signal into the digital offset signal, thus reducing the effect of the internal DC offset of the analog-to-digital converter.

The present invention may be advantageously used with dual bandwidth modulators wherein the digital input signal comprises a selected one of a first digital input signal and a second digital input signal of narrower bandwidth than the first digital input signal. For example, the invention may be used with a first digital input signal that is a CDMA signal, and with a second digital input signal that is an FM signal. More specifically, the CDMA signal may be a direct sequence spread spectrum signal, and the FM signal may be an analog cellular telephone signal. The present invention may also be used in IQ modulators, also referred to as "quadraphase modulators" or "quadrature modulators" that modulate in-phase and quadrature filtered analog signals onto a carrier. Analogous modulation methods may also be provided.

Accordingly, modulation systems and methods for a digital input signal can provide low DC offset notwithstanding the introduction of DC offset by the digital-to-analog converter and/or the low pass filters thereof. High performance and costly digital-to-analog converters need not be used. High performance off-chip low pass filters also need not be used.

BRIEF DESCRIPTION OF THE DRAWINGS

FIGS. 2A and 2B, which when placed together as indicated form FIG. 2, illustrate a first embodiment of dual mode IQ modulation systems and methods according to the present invention.

FIGS. 4A and 4B, which when placed together as indicated form FIG. 4, illustrate an embodiment of single mode IQ modulation systems and methods according to the present invention.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will also be understood that blocks in the figures may be implemented by interchangeable means and steps including but not limited to circuitry, computer hardware and/or computer software.

Figure 1:
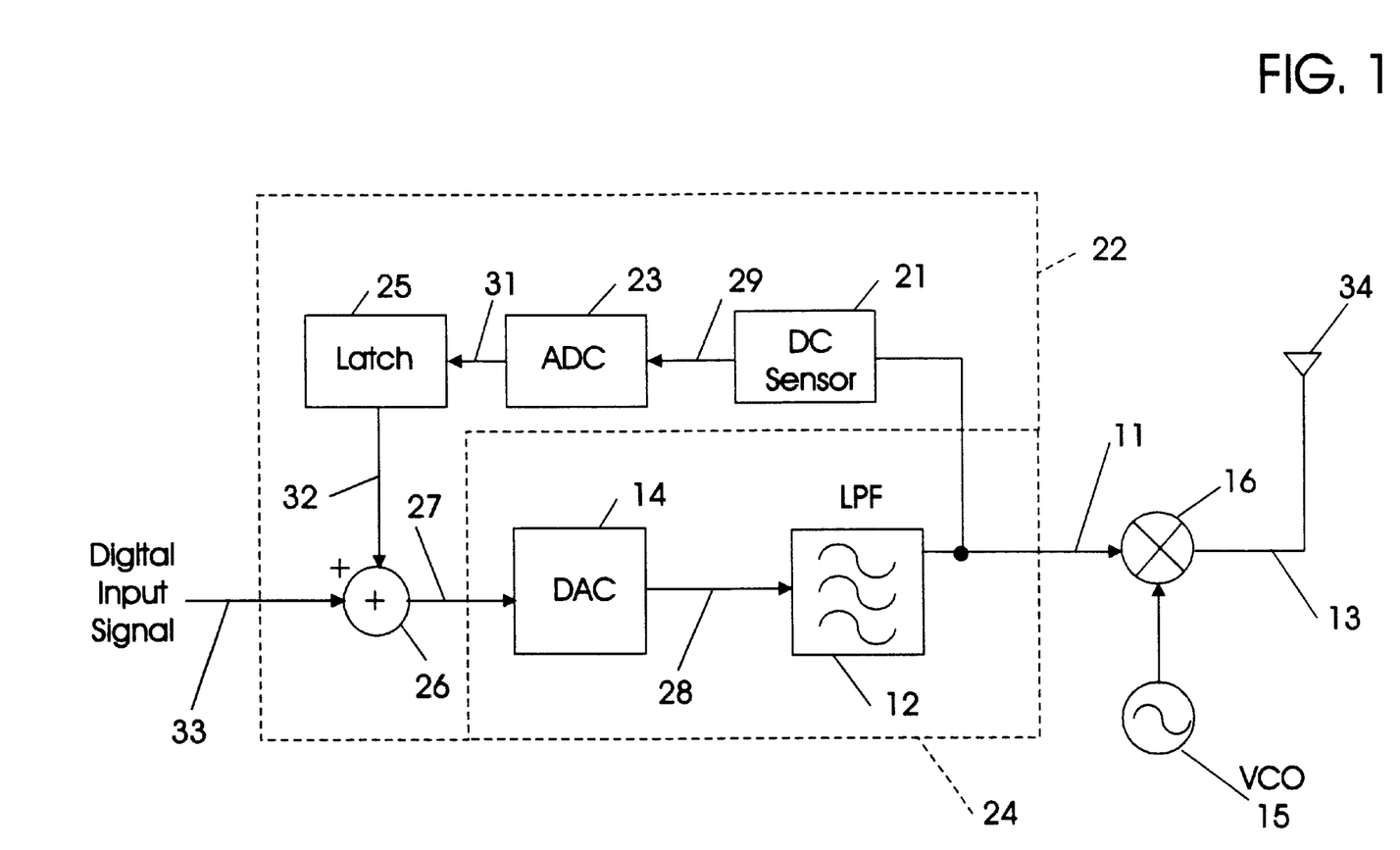
FIG. 1 is a block diagram of modulation systems and methods according to the present invention.

Referring now to FIG. 1, a block diagram of modulation systems and methods for a digital input signal according to the present invention is shown. As shown in FIG. 1, modulation systems and methods according to the present invention include a Digital-to-Analog Converter (DAC) 14 that converts a digital input signal 33 into an analog signal 28. A low pass filter 12, also referred to as an anti-aliasing filter, filters the analog signal 28 to produce a filtered analog signal 11. A modulator 16 modulates the filtered analog signal 11 onto a carrier that is generated by a controlled source, such as a Voltage Controlled Oscillator (VCO) 15. The modulated input signal 13 is then transmitted by a transmit antenna 34. Other transmitting circuitry may also be included, as is well known to those having skill in the art.

Modulating systems and methods as described in the preceding paragraph are well known to those having skill in the art. Unfortunately, however, although the digital input signal 33 may have low DC offset, the DC offset that is introduced by at least one of the digital-to-analog converter 14 and the low pass filter 12 may produce an unacceptably high DC offset. The digital-to-analog converter 14 and low pass filter 12 are collectively labeled as sources of DC offset by dashed block 24.

According to the invention, a DC offset compensator 22 is provided, that compensates for the DC offset in the filtered analog signal 11 that is introduced by the at least one of the digital-to-analog converter 14 and the low pass filter 12. As shown, the DC offset compensator 22 acts upon the digital input signal 33 in the digital domain to compensate for the DC offset in the filtered analog signal 11 that is introduced by at least one of the digital-to-analog converter 14 and the low pass filter 12, to thereby reduce the DC offset to within acceptable limits for the modulation scheme that is used.

More specifically, as shown in FIG. 1, the DC offset compensator 22 preferably includes a DC sensor 21 that senses the DC offset in the filtered analog signal 11. An Analog-to-Digital Converter (ADC) 23 converts the sensed DC offset 29 into a digital DC offset signal 31. A subtractor 26 subtracts the digital DC offset signal 31 from the digital input signal 33 and applies the digital input signal less (minus) the DC offset signal 27, to the digital-to-analog converter 14. Accordingly, the DC offset that is generated in the forward path is sensed and converted to a digital value. The digital value representing the DC offset is then subtracted from the incoming digital input signal 33.

As also shown in FIG. 1, the digital DC offset signal need not be calculated at the same frequency as the digital-to-analog conversion by the digital-to-analog converter 14, in order to compensate for the DC offset. Rather, the DC offset may be determined intermittently, preferably periodically. Accordingly, as shown in FIG. 1, a latch 25 may be used to intermittently and periodically latch the digital DC offset signal 31, such that the latched digital DC offset signal 32 is subtracted from the digital input signal 33. Thus, as will be described below, the latch 25 and/or the analog-to-digital converter 23 may be clocked at lower frequencies than the digital-to-analog converter 14, because the DC offset will generally not vary as rapidly as the digital input signal 33. In a particular example, the DC offset may be sensed once per second, or at other intervals.

Figures 2, 2B:
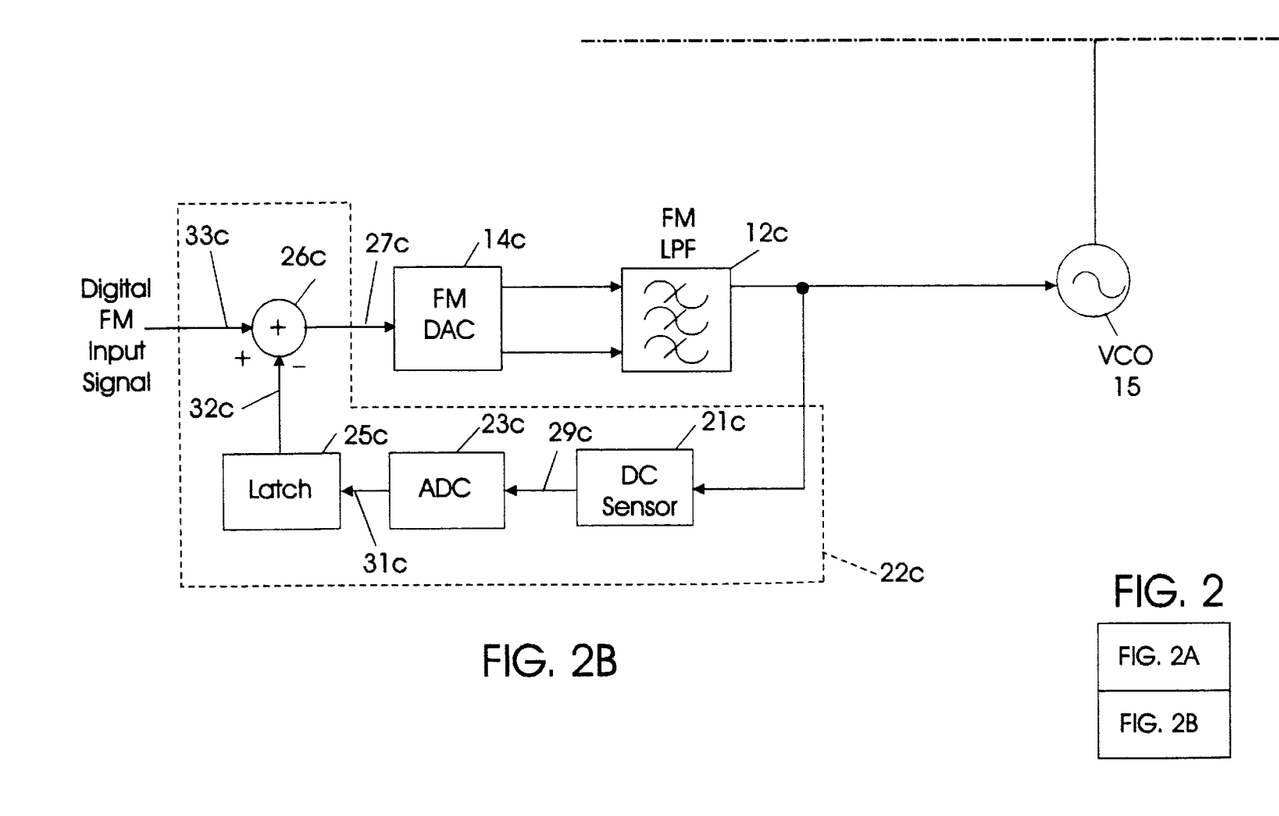
Figure 2A:
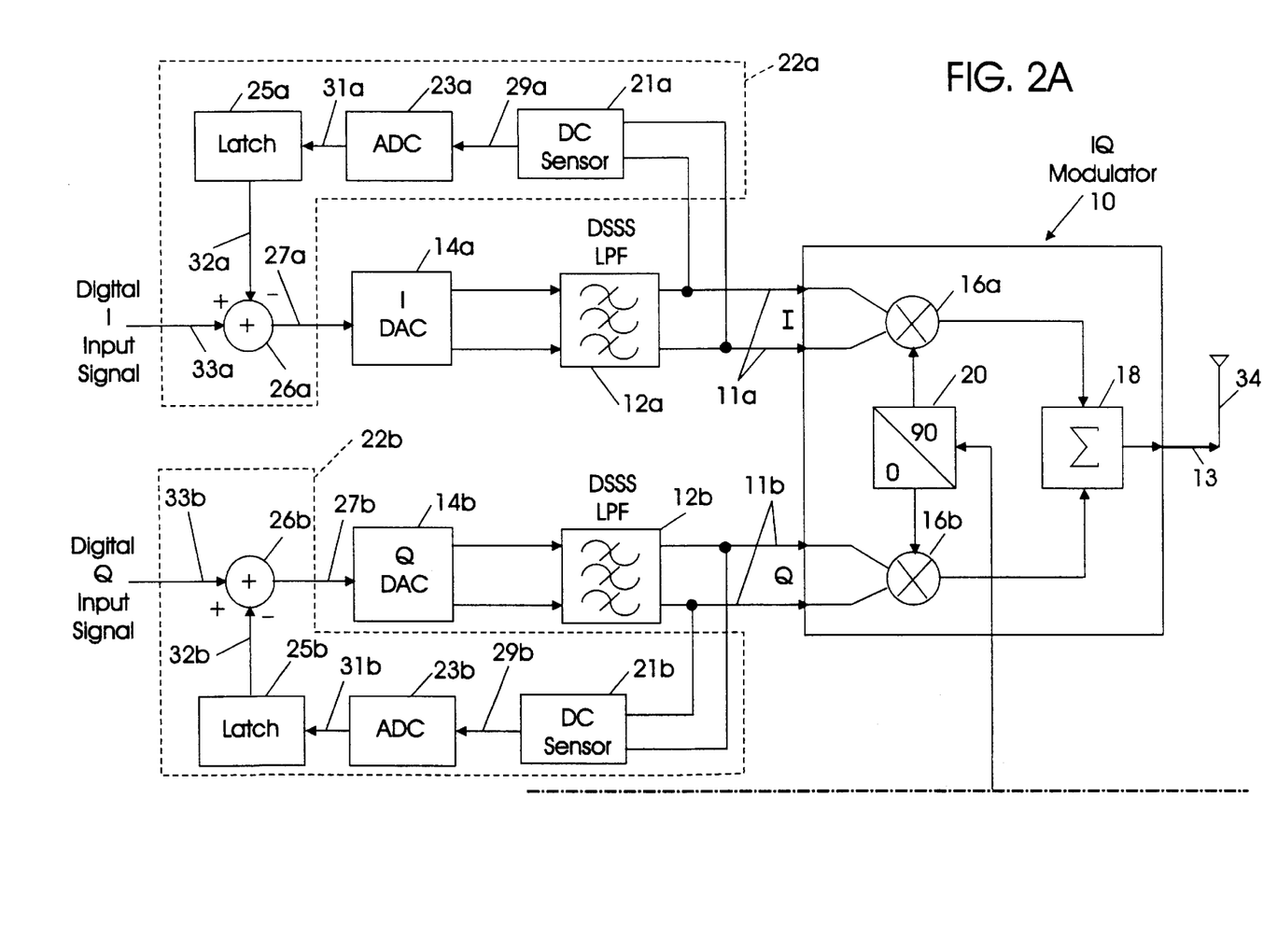

FIG. 2 illustrates a dual mode IQ modulation system according to the present invention. As shown, an IQ modulator 10 includes a quadrature splitter 20, also known as a 90° phase shifter, and a pair of multipliers 16a, 16b coupled to the quadrature splitter. The VCO 15 is coupled to the quadrature splitter 20, to produce 90° phase shifted local oscillator signals. A digital I input signal 33a and a digital Q input signal 33b are provided to respective I and Q paths of the IQ modulation system. The elements in the I path are designated by a reference character a and the elements in the Q path are designated by the reference character b. The IQ modulator 10 modulates the I and Q filtered analog signals 11a and 11b respectively, on a carrier, by summing the outputs of the multipliers 16a and 16b at a summing node 18. The modulated input signal is transmitted via an antenna 34.

The digital-to-analog converters 14a and 14b, low pass filters 12a and 12b and IQ modulator 10 may be used to modulate a high bandwidth CDMA signal, such as a Direct Sequence Spread Spectrum (DSSS) signal, onto a carrier. Since the signal is generated digitally, it is low pass filtered by filters 12a and 12b, to let the information through while removing digitally generated spurs and noise.

In order to use the IQ modulator 10 of FIG. 2 in a dual mode, such as for a narrow bandwidth FM signal, a separate FM digital-to-analog converter 14c and a separate FM low pass filter 12c may be provided. The components in the modulation path of the digital FM input signal 33c are labeled with a reference character c. Baseband circuitry generates the digital FM input signal 33c that is applied to the tune line of the VCO 15, to modulate the FM information onto the carrier for transmission according to the AMPS standard. The low pass filter 12c generally has a different bandpass characteristic than the low pass filters 12a and 12b that are part of the CDMA modulator, due to the widely differing bandwidths of the FM and CDMA signals.

It will be understood that in FIG. 2, three separate DC offset compensators 22a, 22b and 22c are provided for the three input signal paths. However, it will be understood that a single DC offset compensator may be used for both the digital I input signal path and the digital Q input signal path. Moreover, a single DC offset compensator may be used for all three input signal paths of FIG. 2.

Figure 3:
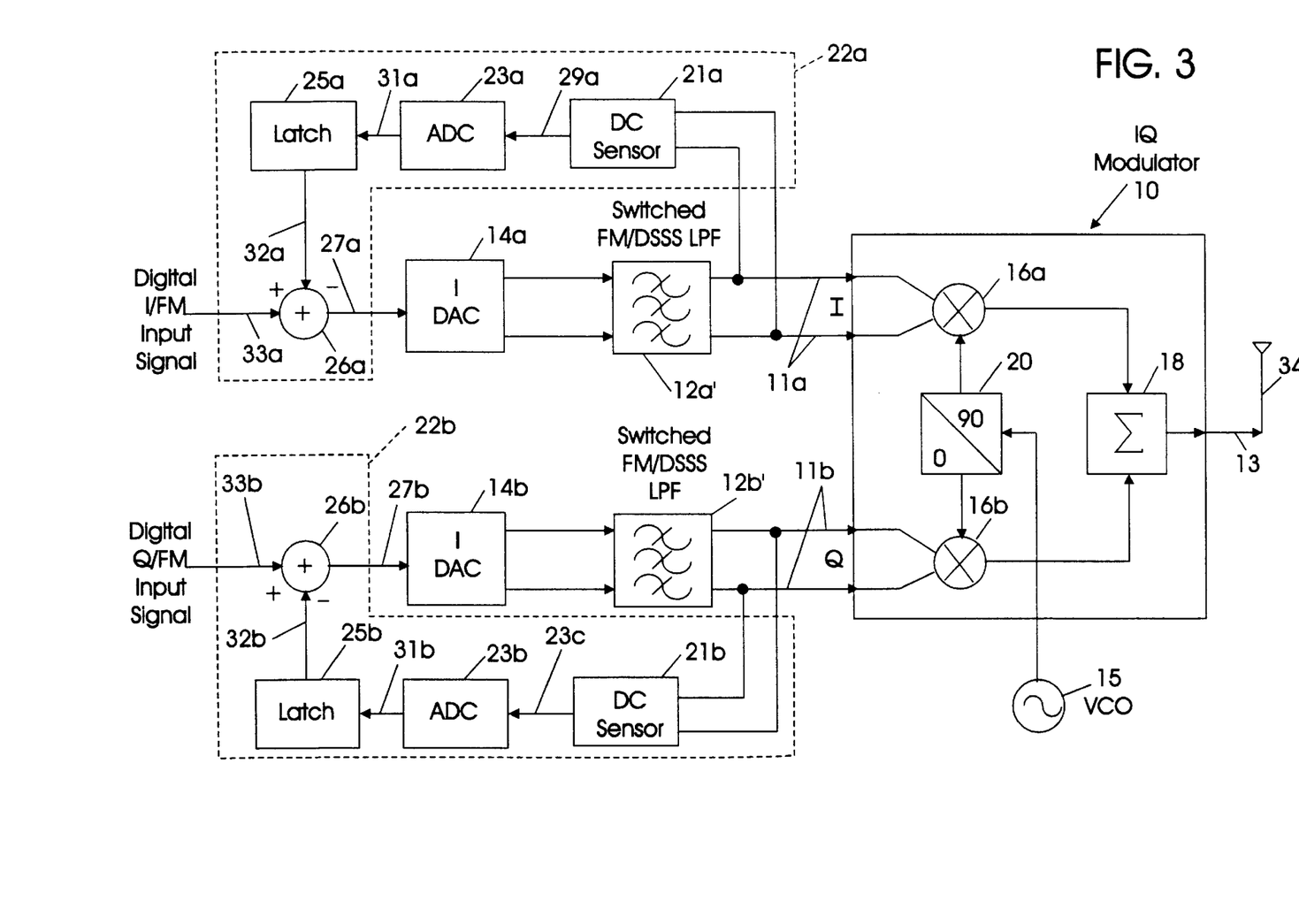
FIG. 3 illustrates a second embodiment of dual mode IQ modulation systems and methods according to the present invention.

A second dual mode modulation system is illustrated in FIG. 3. In this figure, the digital-to-analog converters and low pass filters are shared for the dual-mode operation. In particular, the I DAC 14a and the Q DAC 14b are used for both wideband CDMA and narrowband FM operation. Low pass filters 12a' and 12b' are also used for wideband CDMA and narrowband FM operation. Due to the widely disparate bandwidths of the CDMA signal and the FM signal, the low pass filters 12a' and 12b' should have different bandpass characteristics when in the different modes. In order to share the low pass filters, the bandpass frequency is switched depending upon mode.

Figures 4, 4A:
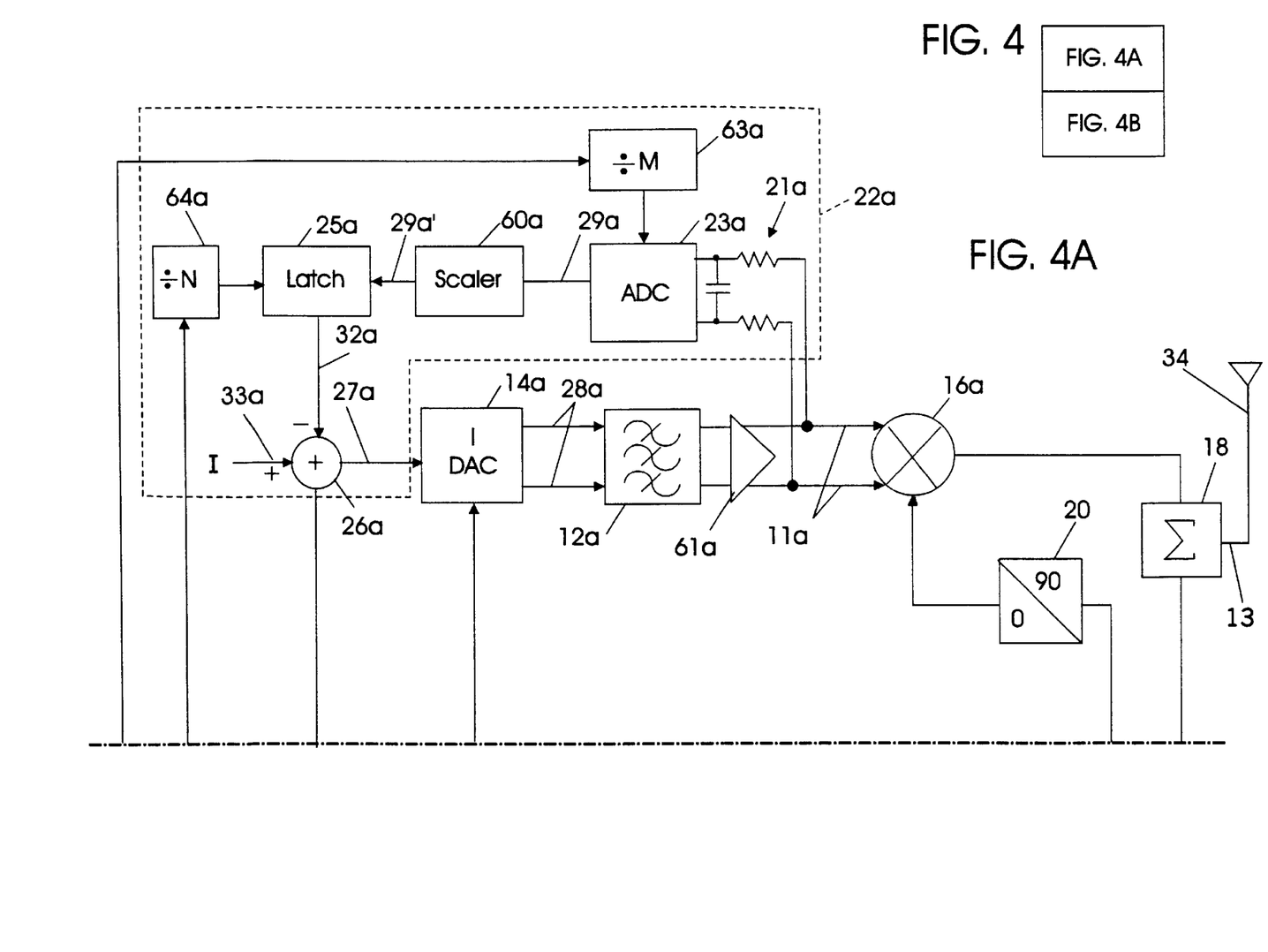
Figure 4B:
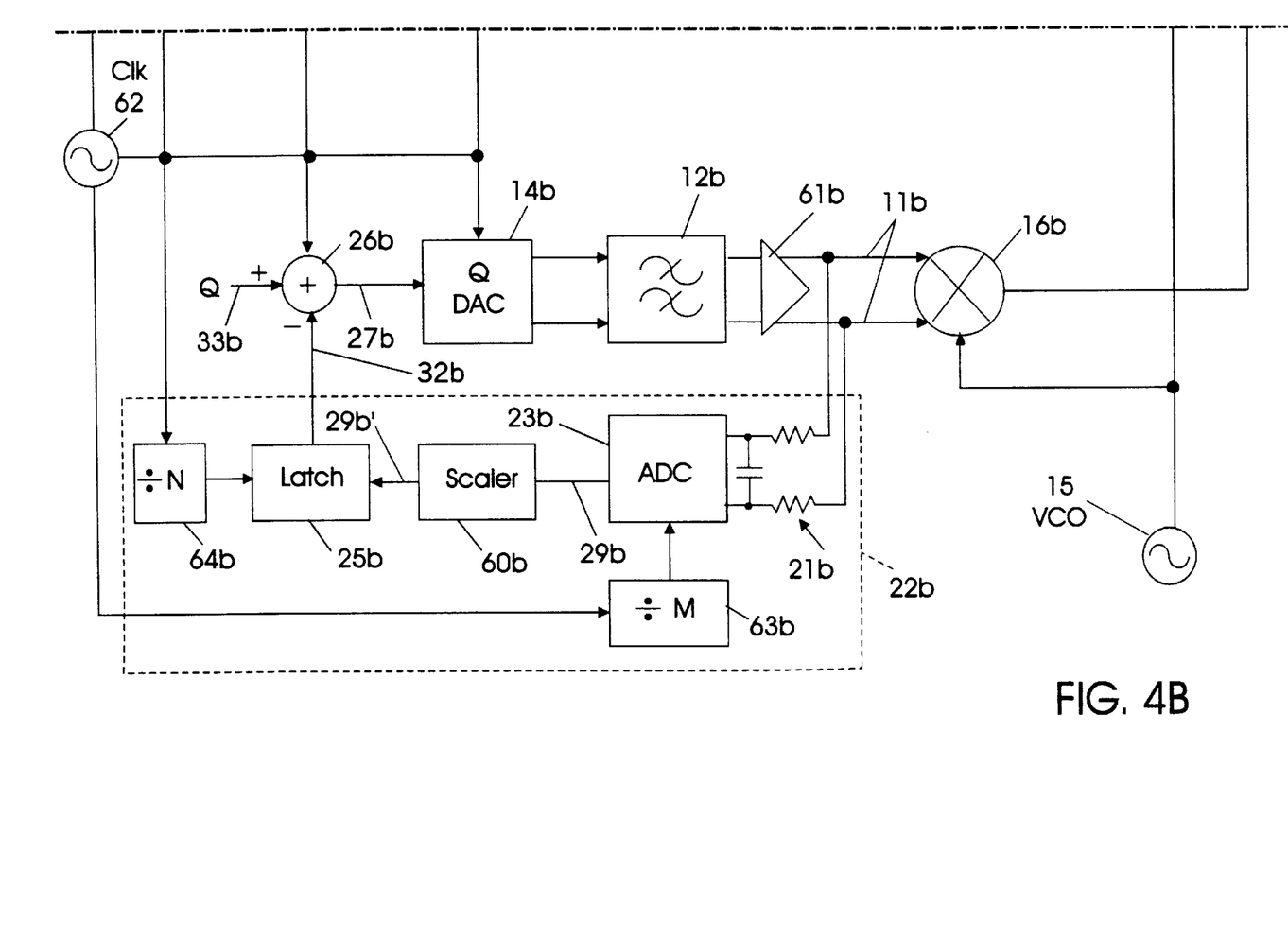

Referring now to FIG. 4, an embodiment of a single mode IQ modulator according to the present invention will now be described. In FIG. 4, an optional scaler 60a, 60b is used between a respective analog-to-digital converter 23a, 23b and a respective latch 25a, 25b. The scaler scales the digital DC offset signal 29a, 29b into a scaled digital DC offset signal 29a', 29b'. Scaling may be used in order to apply a scaling factor to the digital signal produced by the analog-to-digital converter 23a, 23b. For example, when a differential DC voltage is sensed by the DC sensors 21a, 21b of FIG. 4, a scaling factor may need to be used. Also in FIG. 4, an optional amplifier 61a, 61b is used between the respective low pass filter 12a, 12b and a respective modulator 16a, 16b, to provide amplification if necessary. As shown in FIG. 4, the DC offset compensators 22a, 22b can also compensate for DC offset in the amplifiers 61a, 61b.

As also shown in FIG. 4, timing for the analog-to-digital converters 23a, 23b, for the digital-to-analog converters 14a, 14b and for the latches 25a, 25b may also be provided from a common clock 62. It will be understood that the voltage controlled source 15 is also preferably locked to the same reference as the common clock 62. As shown in FIG. 4, the digital-to-analog converters 14a and 14b are prefer-ably clocked by the clock 62. The analog-to-digital converters 23a, 23b are preferably clocked at a first clock rate that is lower than that of clock 62 using divide by M (÷M) circuits 63a, 63b. Moreover, the latches 25a and 25b are latched at a second clock rate that is even lower than the first clock rate using divide by N (÷N) circuits 64a, 64b. First and second clock rates that are lower than the speed of clock 62 may be used, because the DC offset need not be sensed as often as the input signals 33a, 33b are converted to digital, since the DC offset generally changes less rapidly than the input signal itself.

The DC sensors 21a, 21b of FIG. 4 may be provided by passive low pass filters with a low corner frequency. A low comer frequency may be used because only the DC component needs to be sensed. Subtraction in the digital domain may also occur at a low rate, that is preferably gated by dividing the clock 62. DC offset compensators of FIG. 4 may be able to cancel a DC offset that is as small as the Least Significant Bit (LSB) of the digital-to-analog converter 14a, 14b.

The DC offset cancellation that can be accomplished may be limited by the DC offset that is introduced by the analog-to-digital converters 23a, 23b in the DC offset compensators 22a, 22b. Accordingly, low DC offset analog-to-digital converters 23a, 23b are preferably used. A preferred analog-to-digital converter 23a, 23b is a one bit delta-sigma converter. A one bit converter may be used so that the feedback path inside the delta-sigma converter may be obtained using a straight feedback connection without the need for intervening components.

Figure 5:
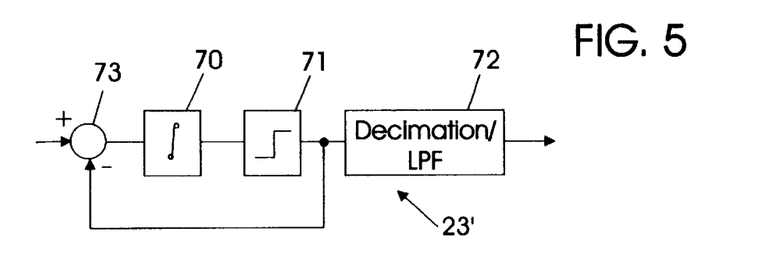
FIG. 5 is a block diagram of a one bit delta-sigma analog-to-digital converter that may be used to compensate for DC offset according to the present invention.

FIG. 5 illustrates a block diagram of a one bit delta-sigma analog-to-digital converter 23'. As shown in FIG. 5, the analog-to-digital converter 23 includes an integrator 70, a comparator 71 and a decimation/low pass filter 72. The output of the comparator 71 is fed back to the input via a summing node 73. The design of a one bit delta-sigma digital-to-analog converter is well known to those having skill in the art, and is described for example in the textbook by Candy and Temes entitled "Oversampling Delta-Sigma Data Converters", IEEE Press, 1992, in the chapter entitled "Oversampling Methods for A/D and D/A Conversion", pp. 1–25, the disclosure of which is hereby incorporated herein by reference.

Accordingly, DC offsets introduced by elements in the forward path of the delta-sigma converter can be nulled. Thus, the only DC offset contributor may be the analog difference amplifier represented by the summing node 73. DC offset can be reduced in this difference amplifier 73, for example by selecting the decimation low pass filter 72 to have a corner at 10 Hz. Thus, the difference amplifier 73 may operate at a very low frequency, for example 10 kHz. The difference amplifier 73 thus can be made with large geometry, low frequency transistors that may have excellent component matching when used in a process that also includes the high frequency digital-to-analog converters 14a, 14b. This good matching can produce low DC offset in the delta-sigma converter.

Preferably, the comer frequency of the sensor 21 may be chosen to be low enough to roll off modulation, and thereby keep modulation out of the feedback loop. The frequency of the one bit delta-sigma converter is preferably selected so as to remove this modulation without aliasing errors.

The rate of latching by the latch 25 is preferably low enough so that the open loop system has settled. The resolution of the feedback is preferably within one least significant bit of the digital-to-analog converter 14. This resolution may be determined by the oversampling ratio between the input and output of the decimation/low pass filter 72.

The largest error correction may be available for the first subtraction. This correction may be accomplished in one step. Alternatively, this correction can be made smoother through a digital filter that may be placed between the latch 25 and the subtractor 26. Alternatively, the transition can be made smoother by constraining the latch to move only one least significant bit per latch instant. The selection may be made based on the desired speed to initially set the compensation. Thereafter, the DC offset compensator may operate in tracking mode, and the same techniques may be used.

Figure 6:
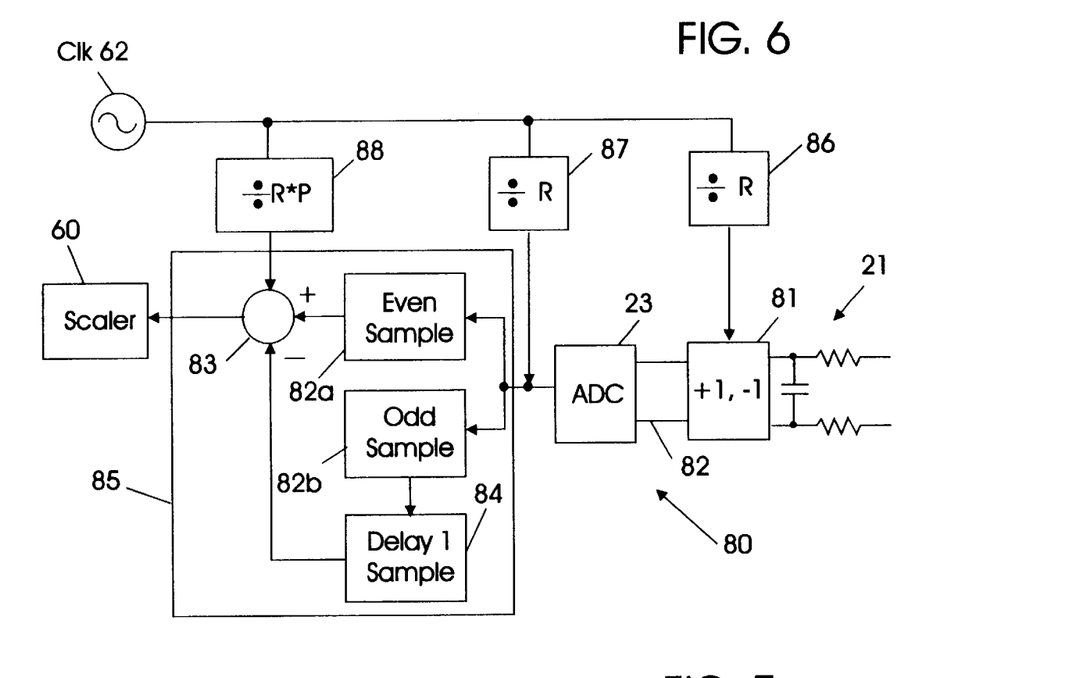
FIG. 6 illustrates another embodiment of an analog-to-digital converter that can be used to compensate for DC offset according to the present invention.
Figure 7:
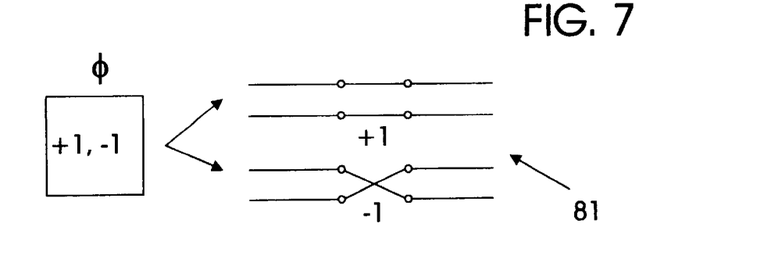
FIG. 7 illustrates operation of a polarity inverter than may be used in FIG. 6.

FIG. 6 illustrates another embodiment of an analog-to-digital converter system 80 that can use any type of analog-to-digital converter 23. As shown in FIG. 6, a polarity inverter 81 is included that periodically inverts the polarity of the sensed DC offset signal. Operation of the polarity inverter 81 is described schematically in FIG. 7.

Referring back to FIG. 6, the analog-to-digital converter 23 converts the periodically polarity-inverted sensed DC offset signal 82 into a digital offset signal. Since alternate samples have been inverted, even samples and odd samples are then latched in first and second latches 82a, 82b. Prior to subtraction by a subtractor 83, one of the samples, such as the odd samples in latch 82b, are delayed by a delay 84.

Subtraction of the polarity inversion samples in block 85 may be clocked using the clock 62, wherein the clock 62 is divided by R and applied to the polarity inverter 81 and analog-to-digital converter 23 by first and second divide by R (÷R) circuits 86, 87. A slower clock that is produced by divide by R times P (÷R*P) circuit 88 may be used to clock the subtractor 83.

The analog-to-digital converter system 80 of FIG. 6 can produce low DC offset due to the following relationships:

$$M_0 = DC_{offset} + E_{measurement},$$

$$M_1 = DC_{offset} + E_{measurement},$$

and $$DC_{offset} = (M_0 - M_1)/2,$$

where $M_0$ is the error measured in one state of the inverter 81, $M_1$ is the error measured in the other state of the inverter 81, $DC_{offset}$ is the DC offset signal 11 and $E_{measurement}$ is the DC error of the measurement system of FIG. 6, that is assumed to be constant between measurements.

When the polarity is changed or inverted, the sign of the measured DC offset changes, but the DC error in the measurement system is unchanged. The error is measured in one state $M_0$ of the inverter and is remeasured in the other state $M_1$. These two measurements are subtracted from each other and scaled by the scaler 60 in the digital domain after the analog-to-digital converter 80. This subtraction can remove any DC error in the analog-to-digital converter 80. In order to line up the even samples with the odd samples, a delay 84 may be used. Thus., DC error in the analog-to-digital converter can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A modulation system for a digital input signal, comprising:
    a digital-to-analog converter that converts the digital input signal into an analog signal;
    a low pass filter that filters the analog signal to produce a filtered analog signal, at least one of the digital-to-analog converter and the low pass filter introducing DC offset into the filtered analog signal;
    a modulator that modulates the filtered analog signal onto a carrier; and
    a DC offset compensator that compensates for the DC offset in the filtered analog signal that is introduced by the at least one of the digital-to-analog converter and the low pass filter by subtracting from the digital input signal, a digital value representing the DC offset in the filtered analog signal that is introduced by the at least one of the digital-to-analog converter and the low pass filter.

2. A modulation system according to claim 1 wherein the DC offset compensator comprises:
    a sensor that senses the DC offset in the filtered analog signal;
    an analog-to-digital converter that is responsive to the sensor to convert the sensed DC offset into a digital DC offset signal; and
    a subtractor that is responsive to the analog-to-digital converter to subtract the digital DC offset signal from the digital input signal, and to apply the digital input signal less the DC offset signal, to the digital-to-analog converter.

3. A modulation system according to claim 2 wherein the DC offset compensator further comprises:
    a scaler that is responsive to the analog-to-digital converter to scale the digital DC offset signal into a scaled digital DC offset signal;
    the subtractor being responsive to the scaler to subtract the scaled digital DC offset signal from the digital input signal.

4. A modulation system according to claim 2 wherein the DC offset compensator further comprises:
    a latch that is responsive to the analog-to-digital converter to intermittently latch the digital DC offset signal, and to apply the latched digital DC offset signal to the subtractor, such that the latched digital DC offset signal is subtracted from the digital input signal.

5. A modulation system according to claim 4 wherein the analog-to-digital converter is clocked at a first clock rate and wherein the latch is clocked at a second clock rate that is lower than the first clock rate.

6. A modulation system according to claim 4 wherein the DC offset compensator further comprises:
    a scaler that is responsive to the analog-to-digital converter to scale the digital DC offset signal into a scaled digital DC offset signal;
    the latch being responsive to the scaler to periodically latch the scaled digital DC offset signal such that the latched scaled digital DC offset signal is subtracted from the digital input signal.

7. A modulation system according to claim 2 wherein the sensor comprises a low pass filter.

8. A modulation system according to claim 2 wherein the analog-to-digital converter is a one-bit delta-sigma analog-to-digital converter.

9. A modulation system according to claim 2 wherein the DC offset compensator further comprises:

a polarity inverter that is responsive to the sensor to periodically invert the polarity of the sensed DC offset and to apply the polarity inverted sensed DC offset to the analog-to-digital converter, the analog-to-digital converter converting the periodically polarity inverted sensed DC offset signal into the digital offset signal.

10. A modulation system according to claim 1:

wherein the digital input signal comprises a selected one of a first digital input signal and a second digital input signal of narrower bandwidth than the first digital input signal; and wherein the modulator is a dual-bandwidth modulator.

11. A modulation system according to claim 10 wherein the first digital input signal is a CDMA signal and wherein the second digital input signal is an FM signal.

12. A modulation system according to claim 11 wherein the CDMA signal is a direct sequence spread spectrum signal and wherein the FM signal is an analog cellular telephone signal.

13. A modulation system according to claim 1 wherein the modulator is an IQ modulator that modulates in-phase and quadrature filtered analog signals onto a carrier.

14. A modulation system for a digital input signal, comprising:

means for converting the digital input signal into an analog signal;

means for low pass filtering the analog signal to produce a filtered analog signal, at least one of the means for converting and the means for low pass filtering introducing DC offset into the filtered analog signal;

means for modulating the filtered analog signal onto a carrier; and means for compensating for the DC offset in the filtered analog signal that is introduced by the at least one of the means for converting and the means for low pass filtering by subtracting from the digital input signal, a digital value representing the DC offset in the filtered analog signal that is introduced by the at least one of the means for converting and the means for low pass filtering.

15. A modulation system according to claim 14 wherein the means for compensating comprises:

means for sensing the DC offset in the filtered analog signal;

means for converting the sensed DC offset into a digital DC offset signal; and means for subtracting the digital DC offset signal from the digital input signal, and for applying the digital input signal less the DC offset signal to the means for converting the digital input signal into an analog signal.

16. A modulation system according to claim 15 wherein the means for compensating further comprises:

means for scaling the digital DC offset signal into a scaled digital DC offset signal;

the means for subtracting being responsive to the means for scaling, to subtract the scaled digital DC offset signal from the digital input signal.

17. A modulation system according to claim 15 wherein the means for compensating further comprises:

means for intermittently latching the digital DC offset signal, and for applying the latched digital DC offset signal to the means for subtracting, such that the latched digital DC offset signal is subtracted from the digital input signal.

18. A modulation system according to claim 17 wherein the means for converting the sensed DC offset into a digital DC offset signal is clocked at a first clock rate and wherein the means for intermittently latching is clocked at a second clock rate that is lower than the first clock rate.

19. A modulation system according to claim 17 wherein the means for compensating further comprises:

means for scaling the digital DC offset signal into a scaled digital DC offset signal;

the means for intermittently latching being responsive to the means for scaling to periodically latch the scaled digital DC offset signal such that the latched scaled digital DC offset signal is subtracted from the digital input signal.

20. A modulation system according to claim 15 wherein the means for sensing comprises means for low pass filtering.

21. A modulation system according to claim 15 wherein the means for converting the sensed DC offset into a digital DC offset signal comprises a one-bit delta-sigma analog-to-digital converter.

22. A modulation system according to claim 15 wherein the compensating means further comprises:

means for periodically inverting the polarity of the sensed DC offset and for applying the polarity inverted sensed DC offset to the means for converting the sensed DC offset in a digital DC offset signal.

23. A modulation system according to claim 14:

wherein the digital input signal comprises a selected one of a first digital input signal and a second digital input signal of narrower bandwidth than the first digital input signal; and wherein the means for modulating is a dual-bandwidth means for modulating.

24. A modulation system according to claim 23 wherein the first digital input signal is a CDMA signal and wherein the second digital input signal is an FM signal.

25. A modulation system according to claim 24 wherein the CDMA signal is a direct sequence spread spectrum signal and wherein the FM signal is an analog cellular telephone signal.

26. A modulation system according to claim 14 wherein the means for modulating is an IQ modulator that modulates in-phase and quadrature filtered analog signals onto a carrier.

27. A modulation method for a digital input signal, comprising the steps of:

converting the digital input signal into an analog signal;

low pass filtering the analog signal to produce a filtered analog signal, at least one of the converting and low pass filtering steps introducing DC offset into the filtered analog signal;

modulating the filtered analog signal onto a carrier; and compensating for the DC offset in the filtered analog signal that is introduced by the at least one of the converting and low pass filtering steps by subtracting from the digital input signal, a digital value representing the DC offset in the filtered analog signal that is introduced by the at least one of the converting and low pass filtering steps.

28. A modulation method according to claim 27 wherein the compensating step comprises the steps of:

sensing the DC offset in the filtered analog signal;

converting the sensed DC offset into a digital DC offset signal; and subtracting the digital DC offset signal from the digital input signal.

29. A modulation method according to claim 28 wherein the compensating step further comprises the step of:

scaling the digital DC offset signal into a scaled digital DC offset signal.

30. A modulation method according to claim 28 wherein the compensating step further comprises the step of:

intermittently latching the digital DC offset signal.

31. A modulation method according to claim 30 wherein the step of converting the sensed DC offset into a digital DC offset signal is clocked at a first clock rate and wherein the step of intermittently latching is clocked at a second clock rate that is lower than the first clock rate.

32. A modulation method according to claim 30 wherein the step of compensating further comprises the step of:

scaling the digital DC offset signal into a scaled digital DC offset signal.

33. A modulation method according to claim 28 wherein the sensing step comprises the step of low pass filtering the filtered analog signal.

34. A modulation method according to claim 28 wherein the step of converting the sensed DC offset into a digital DC offset signal comprises the step of delta-sigma analog-to-digital converting the sensed DC offset into a digital DC offset signal.

35. A modulation method according to claim 28 wherein the compensating step further comprises the step of:

periodically inverting the polarity of the sensed DC offset.

36. A modulation method according to claim 27:

wherein the digital input signal comprises a selected one of a first digital input signal and a second digital input signal of narrower bandwidth than the first digital input signal; and wherein the modulating step is a dual-bandwidth modulating step.

37. A modulation method according to claim 36 wherein the first digital input signal is a CDMA signal and wherein the second digital input signal is an FM signal.

38. A modulation method according to claim 37 wherein the CDMA signal is a direct sequence spread spectrum signal and wherein the FM signal is an analog cellular telephone signal.

39. A modulation method according to claim 27 wherein the step of modulating comprises the step of IQ modulating in-phase and quadrature filtered analog signals onto a carrier.

* * * * *